United States Patent
Yu et al.

(10) Patent No.: US 6,448,606 B1
(45) Date of Patent: *Sep. 10, 2002

(54) SEMICONDUCTOR WITH INCREASED GATE COUPLING COEFFICIENT

(75) Inventors: Allen S. Yu, Fremont; Thomas C. Scholer, San Jose; Paul J. Steffan, Elk Grove, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/513,261

(22) Filed: Feb. 24, 2000

(51) Int. Cl.$^7$ .............................................. H01L 29/788
(52) U.S. Cl. ...................... 257/315; 257/317; 257/510; 257/515; 438/296
(58) Field of Search ................. 257/315, 317, 257/321, 510, 515; 438/221, 260, 296; 365/185.26, 185.28

(56) References Cited

U.S. PATENT DOCUMENTS

| | | | |
|---|---|---|---|
| 5,051,795 A | * 9/1991 | Gill et al. | 257/317 |
| 5,622,881 A | * 4/1997 | Acocella et al. | 438/264 |
| 5,698,879 A | * 12/1997 | Aritome et al. | 257/315 |
| 5,946,230 A | * 8/1999 | Shimizu et al. | 365/185.01 |
| 6,130,129 A | * 10/2000 | Chen | 438/257 |
| 6,159,801 A | * 12/2000 | Hsieh et al. | 438/259 |
| 6,222,225 B1 | * 4/2001 | Nakamura et al. | 257/315 |
| 6,281,103 B1 | * 8/2001 | Doan | 438/593 |
| 6,323,516 B1 | * 11/2001 | Wang et al. | 257/317 |

FOREIGN PATENT DOCUMENTS

JP 4-11-103033 * 4/1999 .......... H01L/27/115

OTHER PUBLICATIONS

Aritome et al., A 0.67um Self–Aligned Shallow Trench Isolation Cell (SA–STI Cell) for 3V–only 256 Mbit NAND EEPROMS, 1994, ieee, iedm–94, pp. 61–64.*

Guillaumot et al., Flash EEPROM Cells Using Shallow Trench Isolation, 1996, IEEE Int'l NonVolatile Memory Technology Conference, pp. 74–75.*

* cited by examiner

Primary Examiner—George C. Eckert, II
(74) Attorney, Agent, or Firm—Mikio Ishimaru

(57) ABSTRACT

A reduced device geometry semiconductor memory device is provided which has increased device efficiency because of an increased gate coupling coefficient. Shallow trench isolations are formed in a semiconductor substrate. The shallow trench isolations are selectively shaped in order to form a control gate dielectric layer later with a large width relative to the width between the floating gates.

12 Claims, 7 Drawing Sheets

SEMICONDUCTOR WITH INCREASED GATE COUPLING COEFFICIENT

CROSS REFERENCE TO RELATED APPLICATION(S)

The present application contains subject matter related to a concurrently filed U.S. Patent Application by Allen S. Yu and Jeffrey A. Shields entitled "DOUBLE SELF-ALIGNING SHALLOW TRENCH ISOLATION SEMICONDUCTOR AND MANUFACTURING METHOD THEREFOR". The related application is assigned to Advanced Micro Devices, Inc. and is identified by docket number E0498 and Ser. No. 09/513,260.

TECHNICAL FIELD

The present invention relates generally to semiconductors and more specifically to high gate constant, shallow trench isolation semiconductor memory devices.

BACKGROUND ART

Flash EEPROMs (electrically erasable programmable read only memories) are a class of nonvolatile semiconductor memory devices that are programmed by hot electron injection and erased by Fowler-Nordheim tunneling. Each memory cell is formed on a semiconductor substrate (i.e., a silicon die or chip) having a heavily doped drain region and a source region embedded therein. The source region further contains a lightly doped, deeply diffused region and a more heavily doped, shallow diffused region embedded into the substrate. A channel region separates the drain region and the source region. The memory cell further includes a multi-layer structure, commonly referred to as a "stacked gate" structure or word line. The stacked gate structure typically includes: a thin gate dielectric or tunnel oxide layer formed on the surface of substrate overlying the channel region; a polysilicon (poly) floating gate overlying the tunnel oxide; an interpoly dielectric overlying the floating gate; and a poly control gate overlying the interpoly dielectric layer. Additional layers, such as a silicide layer (disposed on the control gate), a poly cap layer (disposed on the silicide layer), and a silicon oxynitride layer (disposed on the poly cap layer) may be formed over the control gate. A plurality of Flash EEPROM cells may be formed on a single substrate.

A Flash EEPROM also includes peripheral portions which typically include input/output circuitry for selectively addressing individual memory cells.

The process of forming Flash EEPROM cells is well known and widely practiced throughout the semiconductor industry. After the formation of the memory cells, electrical connections, commonly known as "contacts", must be made to connect the stacked gate structures, the source region, and the drain regions to other part of the chip.

The contact process starts with the formation of sidewall spacers around the stacked gate structures of each memory cell. An etch stop or liner layer, typically a nitride material such silicon nitride, is then formed over the entire substrate, including the stacked gate structure, using conventional techniques, such as chemical vapor deposition (CVD). A dielectric layer, generally of oxide such as boro-phospho-tetra-ethyl-ortho silicate (BPTEOS) or borophosphosilicate glass (BPSG), is then deposited over the etch stop layer. A layer of photoresist is then placed over the dielectric layer and is photolithographically processed to form a photoresist mask having the pattern of contact openings. An an isotropic etch is then used to etch out portions of the dielectric layer to form source and drain contact openings in the oxide layer. The contact openings stop at the source and drain regions in the substrate. The photoresist mask is then stripped, and a conductive material, such as tungsten, is deposited over the dielectric layer and fills the source and drain contact openings to form so-called "self-aligned contacts" (conductive contacts). The substrate is then subjected to a chemical-mechanical polishing (CMP) process which removes the conductive material above the dielectric layer to form the conductive contacts through a contact CMP process.

For miniaturization, it is desirable to dispose the Flash EEPROM cells as closely together as possible. A commonly used process to achieve bit line isolation between the memory cells is local oxidation of silicon (LOCOS) isolation. A problem associated with LOCOS isolation is that some of the LOCOS isolation gets consumed during processing, which creates a surface area profile resembling a bird's beak. The bird's beak surface area profile adds to the minimum dimension between adjacent Flash EEPROM cells and is becoming more problematic as separation between adjacent memory cells diminishes.

Further simplification to reduce the number of process steps is also desirable. Each additional process step introduces added cost, time, and potential manufacturing defects. Therefore, there is always a need to streamline processing by reducing the number of independent masks needed to produce the Flash EEPROM cells.

Another problem associated with Flash EEPROM cells is maintaining the gate coupling coefficient ($C_G$). The $C_G$ is the ratio of the floating voltage with respect to the control voltage. A larger $C_G$ corresponds to greater device efficiency.

A solution, which would allow further miniaturization of semiconductor memory devices without adversely affecting device performance has long been sought, but has eluded those skilled in the art. As the demand for higher performance devices and miniaturization at reduced costs continues at a rapid pace in the semiconductor field, it is becoming more pressing that a solution be found.

DISCLOSURE OF THE INVENTION

The present invention provides a method for reducing semiconductor device geometry by using shallow trench isolation for bit line isolation of floating gates.

The present invention further provides a method for reducing semiconductor device geometry by eliminating the bird's beak phenomenon of local oxidation of silicon (LOCOS) isolation to enable semiconductor gate structures to be positioned closer together.

The present invention further provides a method for forming a semiconductor device that provides increased gate coupling coefficient for greater device efficiency.

The present invention further provides a method for forming a semiconductor device that increases the surface area of the insulator disposed between the control gate and the floating gate of an EEPROM device for greater device efficiency.

The present invention further provides a method for reducing the number of process steps to manufacture semiconductor gate structures.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
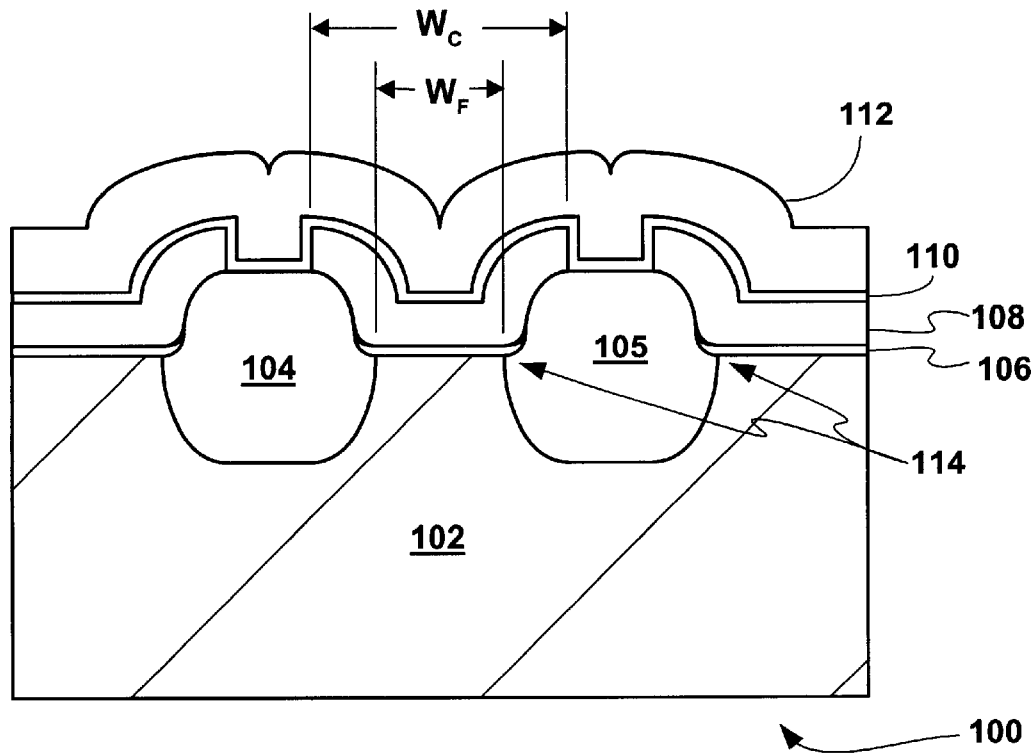
FIG. 1 (PRIOR ART) is a cross-section view of a conventional semiconductor memory device.

Referring now to FIG. 1 (PRIOR ART), therein is shown a cross section of a conventional semiconductor memory device 100, such as a Flash EEPROM (electrically erasable programmable read only memory), in an intermediate state of processing. The structure shown is the result of a "bit-line" isolation technique called the "local oxidation of silicon" (LOCOS) isolation for making a floating gate. At this stage of processing, the floating gate for the semiconductor memory device 100 is shown on a semiconductor substrate 102, generally of doped silicon, with insulating field oxide (FOX) regions 104 and 105, a dielectric tunnel oxide (TOX) layer 106, a first polysilicon (poly) layer 108, an insulating oxynitride (ONO) layer 110, and a second poly layer 112 sequentially deposited on the semiconductor substrate 102. The width of the floating gates is given by $W_F$, and the width of the ONO layer 110 between the control gates is $W_C$ with the widths being measured conformally along the respective surfaces.

A floating gate operates at greatest efficiency when the gate coupling coefficient ($C_G$) is the largest. The $C_G$ is directly proportional to the ratio of the floating voltage with respect to the control voltage:

$$V = \frac{Q}{C} \text{ the floating gate voltage,}$$

$$V_F = \frac{Q}{C_{TOX}} = \frac{(Q)(T_{TOX})}{(A_{TOX})(K_{TOX})} \text{ since}$$

-continued
$$C_{TOX} = \frac{A_{TOX}}{T_{TOX}}(K_{TOX})$$

Since they are in series, the reciprocal of the total capacitance will equal the sum of the reciprocals of the device's coupled capacitors:

$$\frac{1}{C_{TOTAL}} = \frac{1}{C_{TOX}} + \frac{1}{C_{ONO}} \text{ therefore control voltage,}$$

$$V_C = \frac{Q}{C_{TOTAL}} = \frac{Q}{C_{TOX}} + \frac{Q}{C_{ONO}} \text{ and since}$$

$$C_{TOX} = \frac{A_{ONO}}{T_{ONO}}(K_{ONO})$$

$$V_C = \frac{(Q)(T_{TOX})}{(A_{TOX})(K_{TOX})} + \frac{(Q)(T_{ONO})}{(A_{ONO})(K_{ONO})}$$

By definition: $C_G = \frac{V_F}{V_C}$

So, $C_G = \dfrac{\dfrac{(Q)(T_{TOX})}{(A_{TOX})(K_{TOX})}}{Q\left(\dfrac{T_{TOX}}{(A_{TOX})(K_{TOX})} + \dfrac{T_{ONO}}{(A_{ONO})(K_{ONO})}\right)}$ For simplicity, assume $K_{TOX} \approx K_{ONO}$ Since the word line completely overlays the floating gates 108, the surface area that they couple is best described as W=the width of the ONO layer sandwiched between the two poly layers.

So the ratio of: $\dfrac{A_{TOX}}{A_{ONO}} = \dfrac{W_F}{W_C}$

Therefore, $C_G = \dfrac{1}{1 + \left(\dfrac{A_{TOX}}{A_{ONO}}\right)\left(\dfrac{T_{ONO}}{T_{TOX}}\right)} = \dfrac{W_C}{W_C + W_F\left(\dfrac{T_{ONO}}{T_{TOX}}\right)}$ So $C_G$ will increase as $\dfrac{W_F}{W_C}$ decreases.

$C_{TOX}$=Tunnel oxide capacitance
$C_{ONO}$=ONO capacitance
$A_{TOX}$=Surface area of tunnel capacitor
$A_{ONO}$=Surface area of ONO capacitor
$T_{TOX}$=Tunnel oxide thickness
$T_{ONO}$=ONO thickness In its reduced form, $C_G$ is a function of the ratio of the conformal width of the floating gate ($W_F$) and the width of the control gate ($W_C$). The larger $W_C$ is relative to $W_F$, the greater the device efficiency.

During the local oxidation of silicon (LOCOS) process, as the silicon in the semiconductor substrate 102 is consumed by the oxide, the FOX regions 104 and 105 grow under the TOX layer 106 causing bird's beaks 114. With dimensions shrinking for ever tighter geometry and greater memory cell density, the LOCOS process becomes inadequate because the bird's beaks 114 encroachment becomes proportionately too large.

Figure 2:
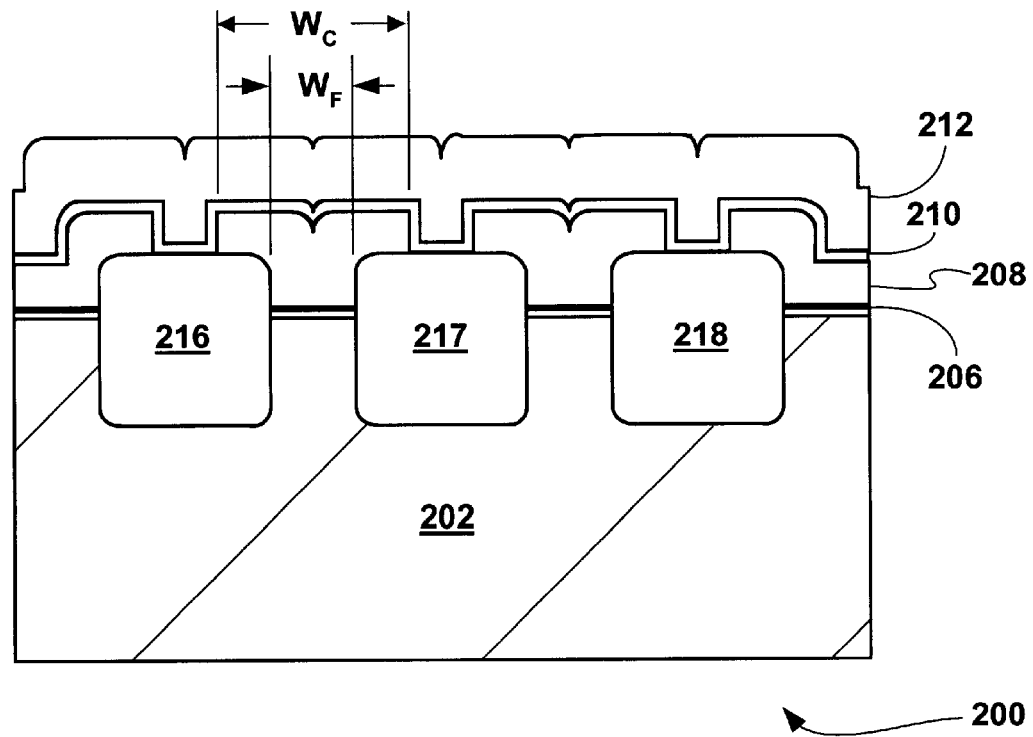
FIG. 2 (PRIOR ART) is a cross-section view of an alternative isolation scheme for a conventional semiconductor memory device.

Referring now to FIG. 2 (PRIOR ART), therein is shown a relatively new isolation structure in an intermediate state of processing for another conventional semiconductor memory device 200. The structure now coming into use is the result of a "bit-line" isolation technique called "shallow trench isolation" (STI). At this stage of processing, the floating gate for the Flash EEPROM is shown on a semiconductor substrate 202 with an oxide, shallow trench isolations (STIs) 216–218, a TOX layer 206, a first poly layer 208, an ONO layer 210, and a second poly layer 212 deposited on the semiconductor substrate 202. This process does not have the bird's beak surface area profile and, thus, allows for greater density over the LOCOS process. However, the tighter pitch among the STIs 216–218 and the more vertical surface area profile of the first poly layer 208 lessens the generally horizontal surface area of the ONO layer 210 within $W_c$. The ONO surface area is directly proportional to $C_G$ and is a contributing factor in determining the $C_G$. The lower the ONO surface area, the lower the $C_G$. Accordingly, the FIG. 2 (PRIOR ART) approach permits greater density of the semiconductor memory devices but decreases the efficiency of each semiconductor memory device.

Figure 3:
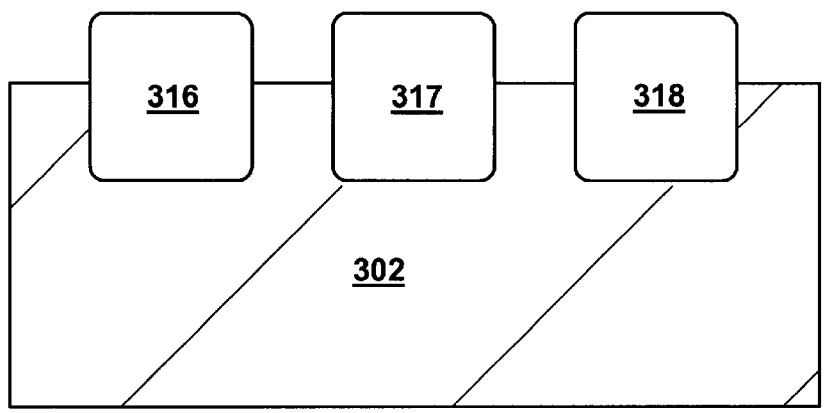
FIG. 3 is a cross-section view of a semiconductor device in an intermediate state of processing according to the present invention.

Referring now to FIG. 3, therein is shown a cross section of a semiconductor memory device 300 in an intermediate state of processing. At this stage are shown a semiconductor substrate 302 and embedded STIs 316–318. The STIs 316–318 are formed conventionally using processing techniques well known in the art of semiconductor processing. A film (not shown), preferably silicon nitride, is used to define the height of the STIs 316–318 that is exposed above the semiconductor substrate 302. The STIs 316–318 are a predetermined configuration. Many configurations of the STIs 316–318 will be described in accordance with the present invention. For simplicity of illustration, only three of the STIs 316–318 are shown.

Referring now to FIGS. 4A through 7C, therein are shown the sequence of process steps for forming a floating gate for an EEPROM device formed on a semiconductor substrate in accordance with the present invention.

Figure 4A:
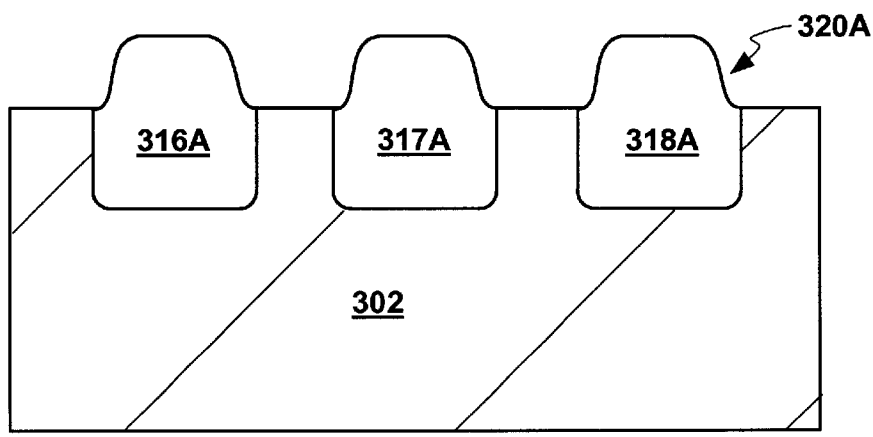
FIGS. 4A, 4B, and 4C are cross-section views after a step of etching the exposed shallow trench isolation (STI) with respective anisotropic, isotropic, or combination etches to produce characteristic surface area profiles.

Referring now to FIG. 4A, therein is shown the semiconductor memory device 300A after the step of etching the exposed STIs 316A–318A with an isotropic etch to round the corners and create single curved surface area profiles 320A. An anisotropic etch, or a combination of both isotropic and anisotropic etches, may be employed to produce other surface area profiles. The exposed STIs 316A–318A exhibit convex curve profiles 320A. It should be noted that the exact curve of the profile 320A is not critical. Other curves can be employed.

Figure 4B:
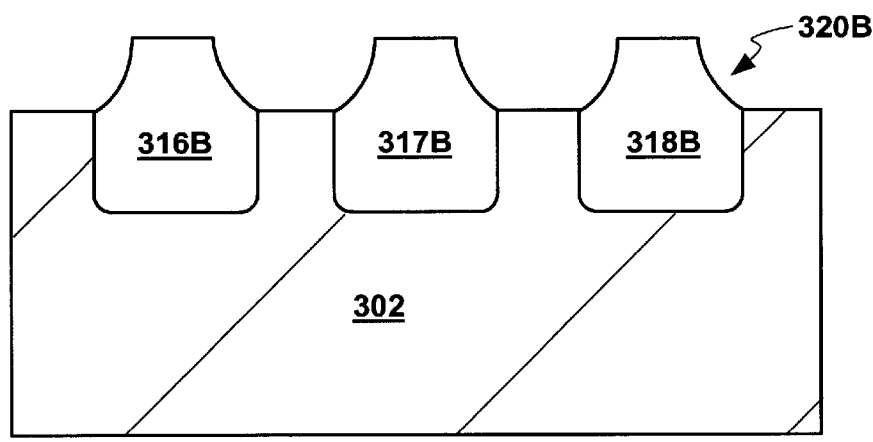

Referring now to FIG. 4B, therein is shown the semiconductor memory device 300B after the step of etching the exposed STIs 316B–318B with an isotropic etch to round the corners and create single curved surface area profiles 320B. The exposed STIs 316B–318B exhibit concave curved profiles 320B. Accordingly, curves exhibiting characteristics between and combinations of a concave curve and a convex curve are suitable for the present invention.

Figure 4C:
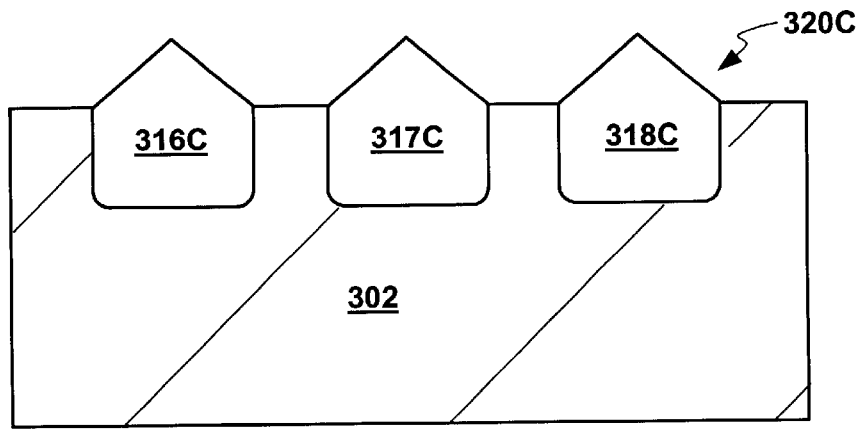

Referring now to FIG. 4C, therein is shown the semiconductor memory device 300C after the step of etching the predetermined configured STIs 316C–318C using conventional etching tools. Conventional etching procedure channels the power of the etcher from either the topside of the STIs 316C–318C toward the bottom or vice-versa. According to the present invention, the STIs 316C–318C are etched from the side at an angle rather than from the top or bottom. Accordingly, by directing the etching power at an angle, conventional anisotropic, isotropic, or a combination of anisotropic and isotropic etching forms linear rooftop surface areas 320C on the STIs 316C–318C.

As seen from FIGS. 4A, 4B, and 4C, the different etched configurations provide different STI surface area profiles 320A, 320B, and 320C and different combinations of $W_F$ and $W_C$.

Figure 5A:
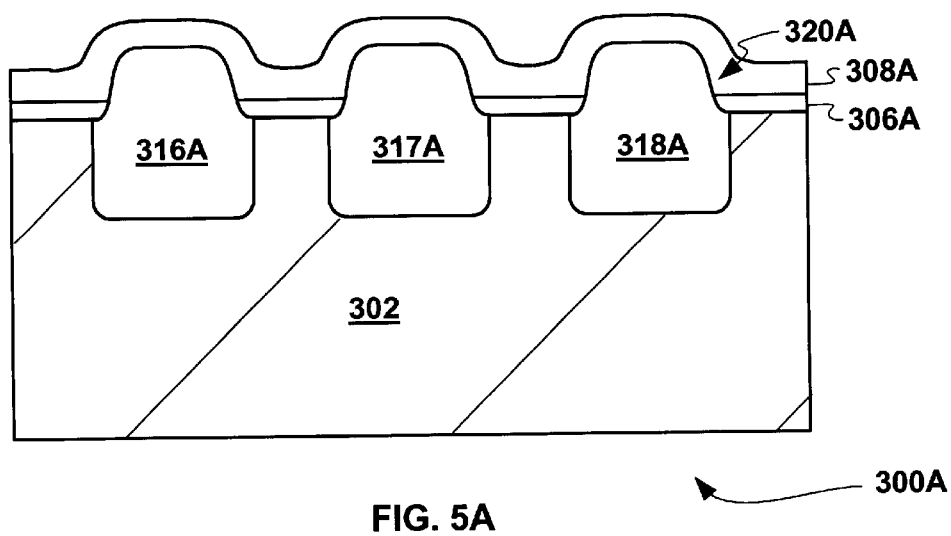
FIGS. 5A, 5B, and 5C are cross-section views after a step of growing a tunnel oxide (TOX) layer and depositing a first polysilicon (poly) layer over the respective surfaces of the structures FIGS. 4A, 4B, and 4C.
Figure 5B:
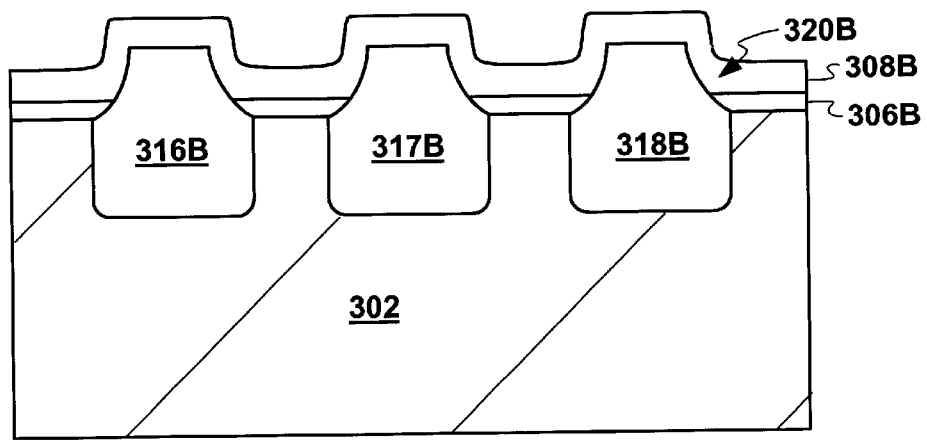
Figure 5C:
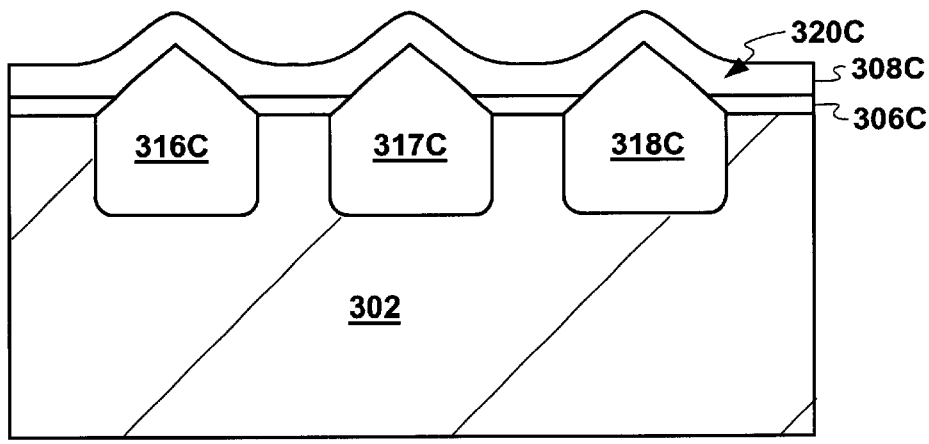

Referring now to FIGS. 5A, 5B and 5C, therein are shown the respective FIGS. 4A, 4B, and 4C semiconductor memory devices 300A, 300B, and 300C after the steps of growing TOX layers 306A, 306B, and 306C, respectively, and depositing a first poly layer 308A, 308B, and 308C, respectively. It will be noted that the first poly layers 308A, 308B, and 308C are conformal and have surface area profiles that match the surface area profiles of the STI surface area profiles 320A, 320B, and 320C, respectively.

The TOX layers 306A 306B, and 306C are thin and use the silicon in the semiconductor substrate 302 as a silicon source for their formation. Thus, the TOX layers 306A, 306B, and 306C are not formed on top of the STIs 316A through 318A, 316B through 318B, and 316C through 318C, respectively, since they contain no free silicon.

Specifically, FIG. 5A shows the semiconductor memory device 300A after the steps of growing the TOX layer 306A and depositing a first poly layer 308A over the entire surface. FIG. 5B shows the semiconductor memory device 300B after the steps of growing the TOX layer 306B and depositing a first poly layer 308B over the entire surface. FIG. 5C shows the semiconductor memory device 300C after the steps of growing the TOX layer 306C and depositing a first poly layer 308C over the entire surface. It will be noted that the first poly layers 320A, 320B, and 320C are conformal and have a surface area profile that match the STI surface area profiles 320A, 320B, and 320C, respectively.

Figure 6A:
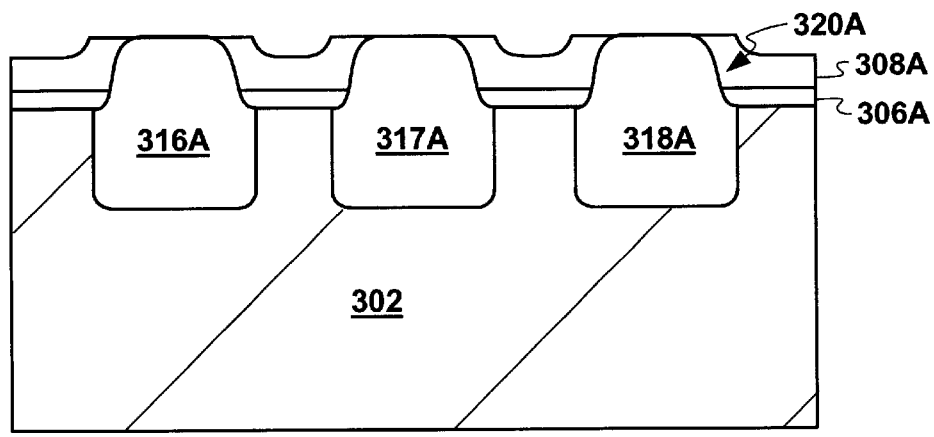
FIGS. 6A, 6B, and 6C are cross-section views after a step of chemical-mechanical polishing (CMP) of the entire surface stopping at the top surface of the respective STIs of FIGS. 4A, 4B, and 4C.
Figure 6B:
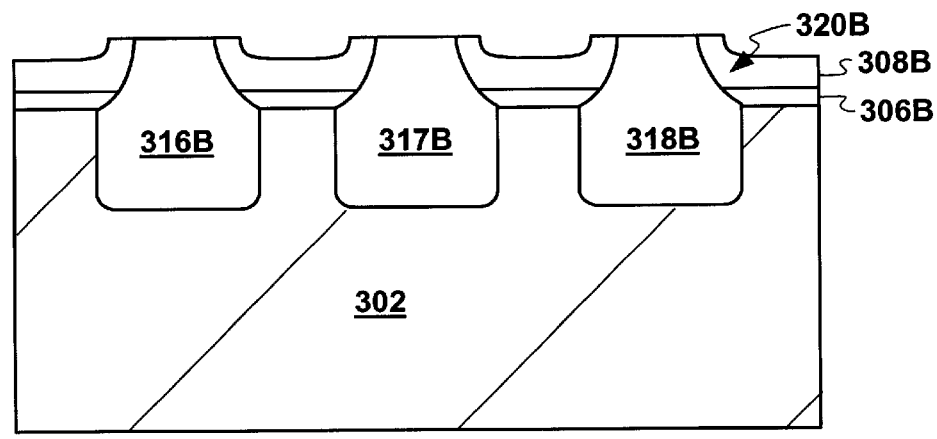
Figure 6C:
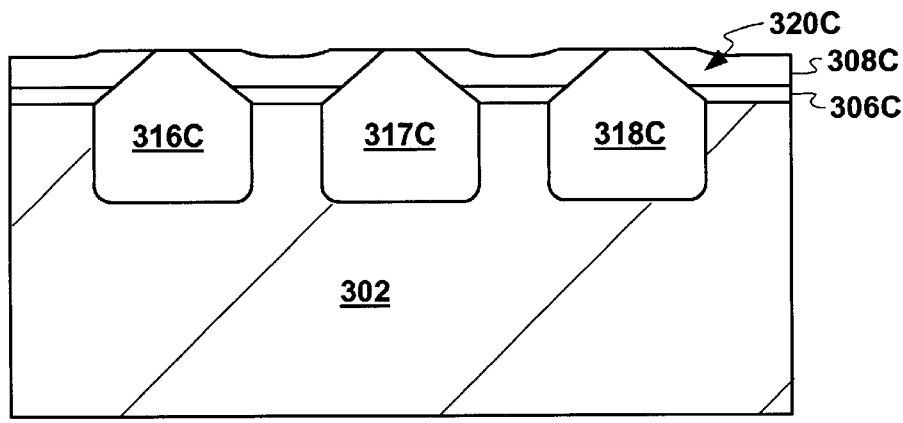

Referring now to FIGS. 6A, 6B, and 6C, therein are shown the semiconductor memory devices 300A, 300B, and 300C after the step of chemical-mechanical polishing (CMP) of the first poly layers 308A, 308B, and 308C, respectively, stopping at the top surfaces of STIs 316A through 318A, 316B through 318B, and 316C through 318C, respectively. Referring to FIG. 6A, the surface area profile of the first poly layer 308A among the STIs 316A–318A appears as large convex curves. Referring to FIG. 6B, the surface area profile of the first poly layer 308B among the STIs 316B–318B appears as large concave curves. Referring to FIG. 6C, the surface area profile of the first poly layer 308C appears as flattened rooftops. The CMP removes portions of the first poly layers 308A, 308B, and 308C to expose their respective STIs 316A through 318A, 316B through 318B, and 316C through 318C. The extent of the CMP determines the magnitude of $C_G$. The more planar and thicker the first poly layers 308A, 308B, and 308C are, the lower the resulting $C_G$ will be since the ONO surface area will be directly proportional to the $C_G$. It would be understood that the first poly layers 308A, 308B, and 308C would appear flat if the layers were sufficiently thick.

Figure 7A:
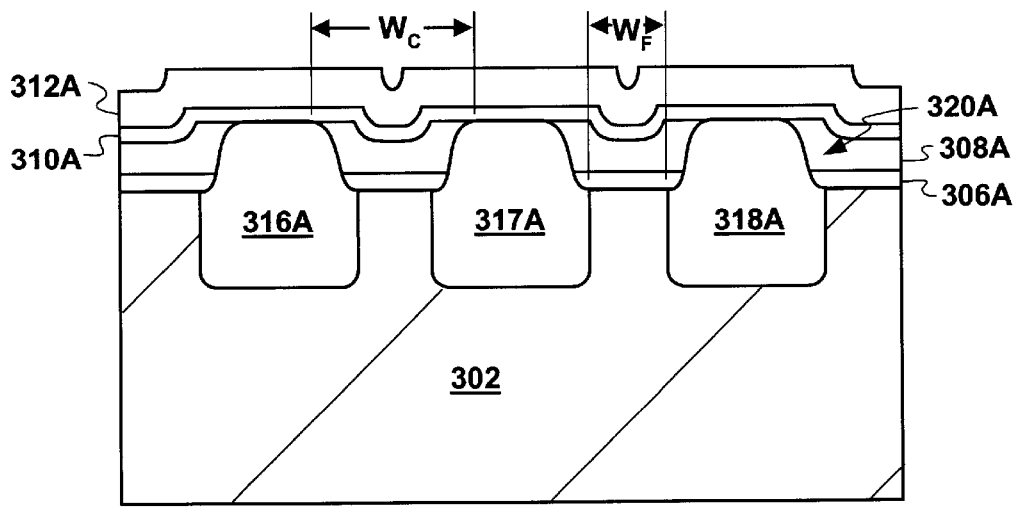
FIGS. 7A, 7B, and 7C are cross-section views of the present invention of the respective structures of FIGS. 5, 4A, 4B, and 4C, which are equivalent to FIG. 2.
Figure 7B:
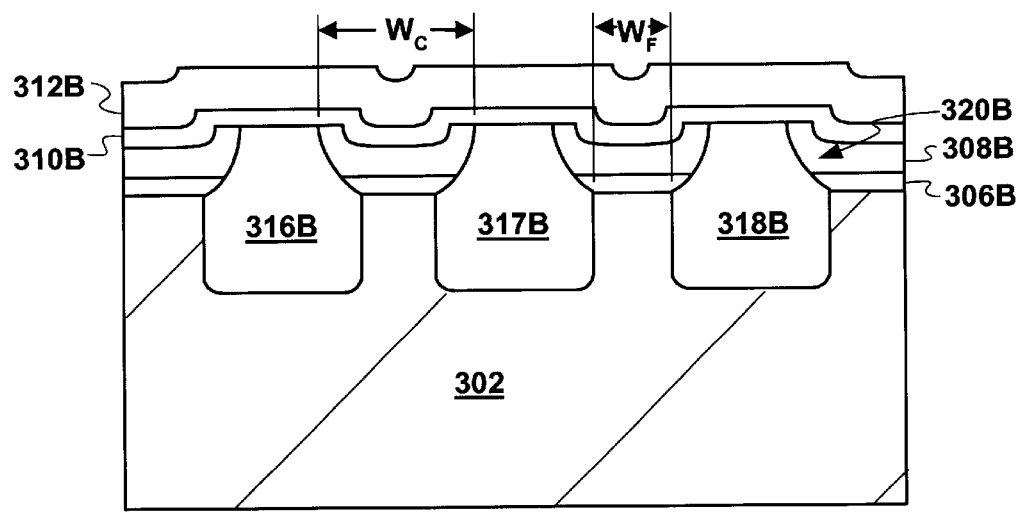
Figure 7C:
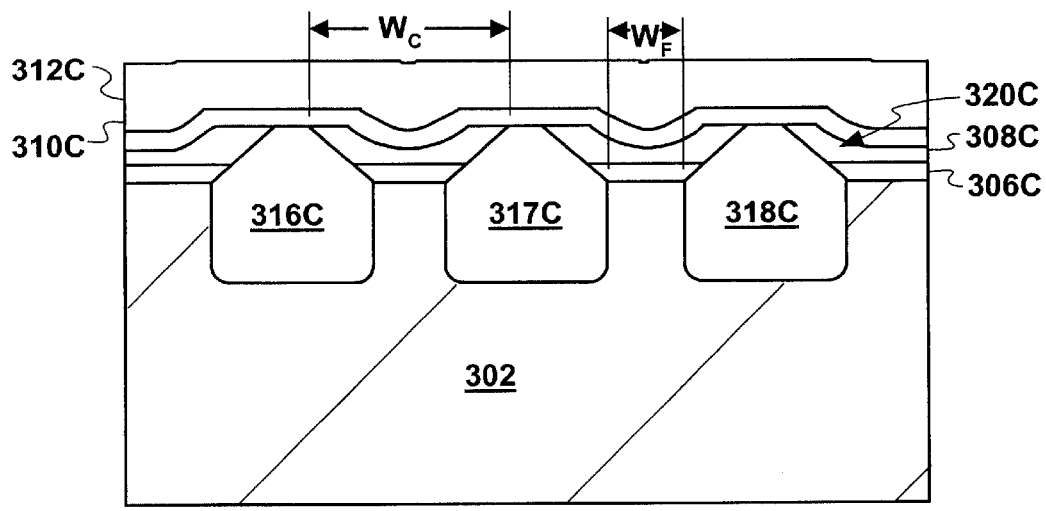

Referring now to FIGS. 7A, 7B, and 7C, therein are shown the semiconductor memory devices 300A, 300B, and 300C after the steps of forming ONO layers 310A, 310B, and 310C on top of the first poly layers 308A, 308B, and 308C, respectively, and depositing second poly layers 312A, 312B, and 312C on top of the ONO layers 310A, 310B, and 310C, respectively.

Referring to FIG. 7A, the surface area profile of the second poly layer 312A among the STIs 316A–318A appears as small convex curves. Referring to FIG. 7B, the surface area profile of the second poly layer 312B among the STIs 316B–318B appears as small concave curves. Referring to FIG. 7C, the surface area profile of the second poly layer 312C among the STIs 316C–318C is trapezoidal shaped and conforms to the ONO layer 310C. It would be understood that the second poly layers 312A, 312B, and 312C would appear flat if the layers were sufficiently thick.

The ratios of $W_C$ and $W_F$ are large and the surface areas for the ONO layers 310A 310B, and 310C are also increased by the varying configurations of the first poly layers 308A, 308B, and 308C, respectively. Accordingly, a gate structure for EEPROMS having STIs to achieve bit line isolation and high device efficiency is provided. The STIs afford production of EEPROM cells with greater density for tighter geometry and greater memory cell density.

In summary, FIGS. 4A through 7C illustrate embodiments of the present invention for fabricating a semiconductor floating gate for an EEPROM with STIs for isolation of the bit lines. The STIs are formed in a semiconductor substrate using conventional process methods. A photoresist trench mask is deposited, patterned using conventional lithographic illuminating radiation sources, and developed. The photoresist acts as a mask for the formation of the STIs. A film such as silicon nitride is used to define an exposed area of the STIs above the semiconductor substrate. The exposed area of the STIs are etched using conventional isotropic, anisotropic, or a combination anisotropic/isotropic etch to achieve increased surface area profiles of the STIs. The increased surface area profiles for the subsequently formed ONO layer increase the $C_G$ for the devices. Accordingly, the present invention provides gate structures having STIs that afford higher $C_G$.

The CMP step for achieving "bit-line" isolation in the semiconductor device has the advantage of providing a self-aligned feature for the first poly layer. The CMP removal of the excess first poly layer provides "bit-line" isolation between the STIs, and the isolation process is automatic and self-aligned. The self-aligned feature for "bit-line" isolation is of paramount importance, particularly when device geometry becomes ever minute.

Referring now to FIGS. 8 through 11, therein are shown the sequence of process steps for forming a floating gate for an EEPROM device formed on a semiconductor substrate in accordance with an alternative embodiment of the present invention.

Figure 8:
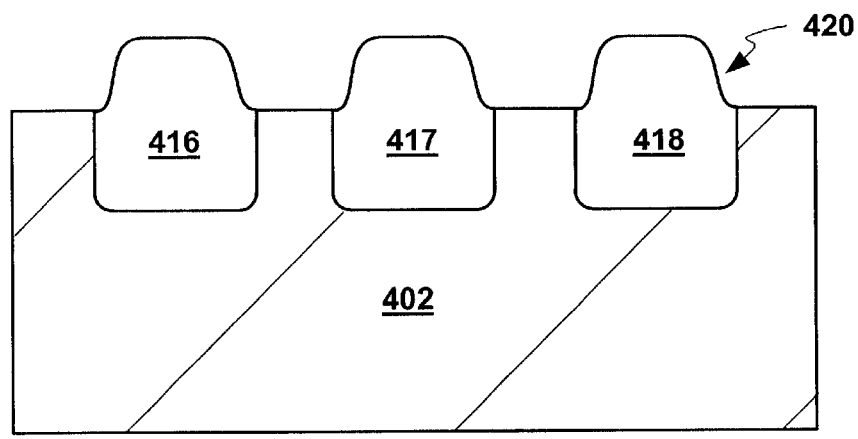
FIG. 8 is a cross-section view of a semiconductor device in an intermediate state of processing in an alternative embodiment of the present invention.

Referring now to FIG. 8, therein is shown a semiconductor memory device 400 in a semiconductor substrate 402 after the step of etching the predetermined configured STIs 316–318 of FIG. 3 with an isotropic etch to round the corners and create a single curved surface area profile 420 for STIs 416–418. An anisotropic etch or a combination of both isotropic and anisotropic etches may be employed to produce other surface area profiles. The exposed STIs 416–418 exhibit the large curve surface area profile 420. Other curves can also be employed.

Figure 9:
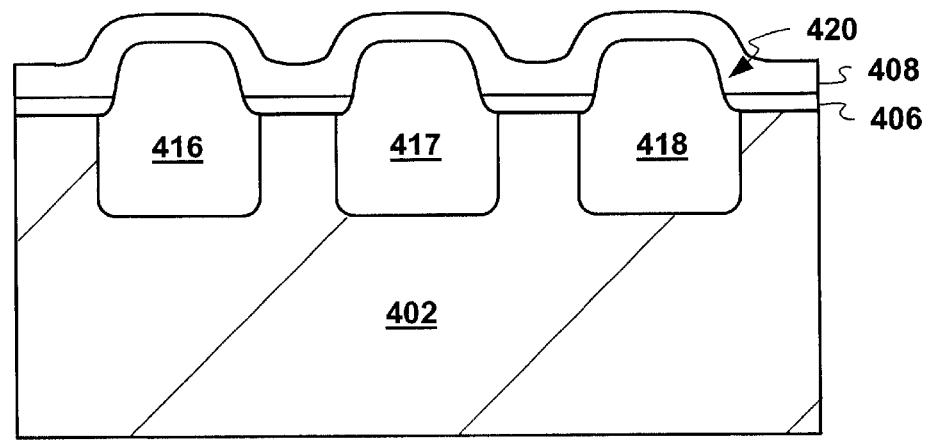
FIG. 9 is a cross-section view after a step of growing a tunnel oxide (TOX) layer and depositing a first polysilicon (poly) layer over the entire surface of the structure of FIG. 8.

Referring now to FIG. 9, therein is shown the semiconductor memory device 400, as illustrated in FIG. 8, after the steps of growing TOX layer 406 and depositing a first poly layer 408, respectively. It will be noted that the first poly layer 408 is conformal and has a surface area profile that matches the surface area profile of the STI.

The TOX layer 406 is thin and uses the silicon in the semiconductor substrate 402 as a silicon source for its formation. Thus, the TOX layer 406 is not formed on top of the STIs 416–418 since they contain no free silicon. Accordingly, FIG. 9 shows a semiconductor memory device 400 after the step of growing the TOX layer 406 and depositing the first poly layer 408 over the entire surface.

Figure 10:
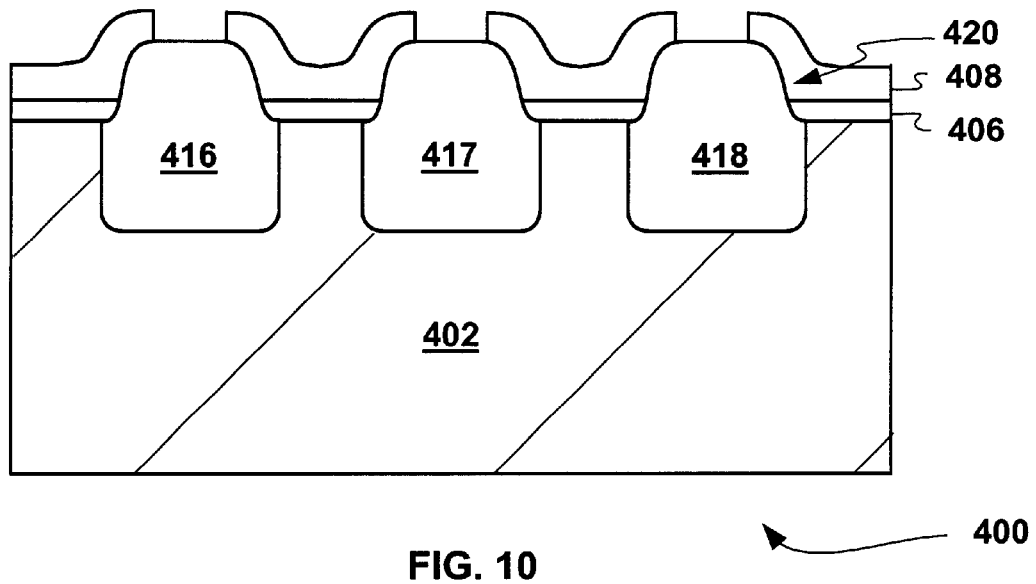
FIG. 10 is a cross-section view after a step of isotropically etching the first poly layer stopping at the top surface of the STIs of the structure of FIG. 9.

Referring now to FIG. 10, therein is shown the semiconductor memory device 400 after the steps of photolithographically processing, developing, and isotropically etching an area of the first poly layer 408 over the STIs 416–418, stopping at the top surfaces of the STIs 416–418 to expose the STIs 416–418. The isolation between the first poly layer 408 and the STIs provides bit lines isolation for the semiconductor memory device 400. The surface area profile of the first poly layer 408 among the STIs 416–418 appears as large arches with cutouts in the middle of each arch. The cutouts in the middle of each arch profile serve to isolate the first poly layer 408 among the STIs 416–418 and increase the surface area of the ONO surface area to be formed for increasing the $C_G$. The ONO surface area is directly proportional to and is a contributing factor of the resulting $C_G$ of the completed semiconductor memory device 400.

Figure 11:
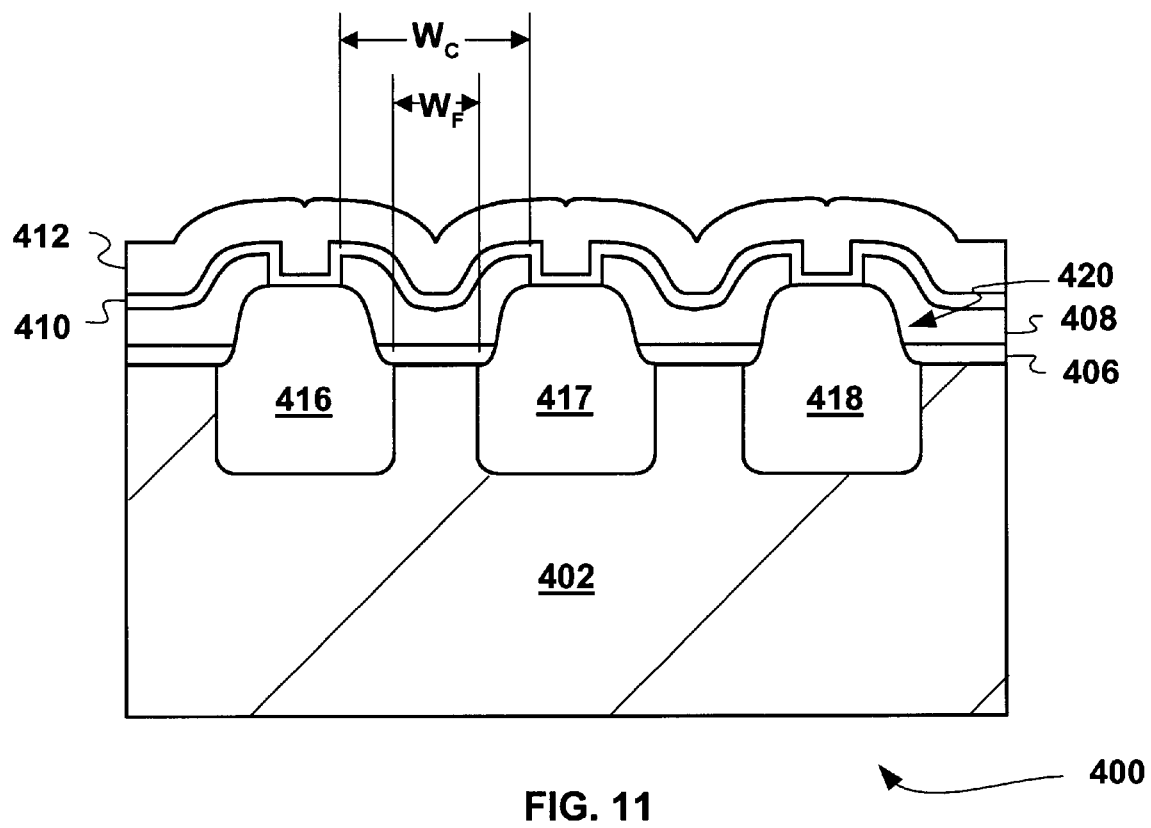
FIG. 11 is a cross-section view of the structure of FIG. 10, which is equivalent to FIG. 2.

Referring now to FIG. 11, therein is shown the semiconductor memory device 400 after the steps of forming an ONO layer 410 on top of the first poly layer 408 and the STIs, and depositing a second poly layer 412 on top of the ONO layer 410. The surface area profile of the ONO layer 410 conforms to the first poly layer 408 and the tops of the STIs 416–418.

The ratio of $W_C$ and $W_F$ is large and the surface area for the ONO layer 410 is also increased by the varying pitch of the first poly layer 408. The surface area of the ONO layer 410 is further increased by isotropic etching the first poly layer 408 that provides the isolation between the STIs 416–418 and the first poly layer 408. Accordingly, a gate structure for EEPROMS having STIs to achieve bit line isolation and high device efficiency is provided. The STIs afford production of EEPROM cells with greater density for tighter geometry and greater memory cell density.

In summary, FIGS. 8 through 11 illustrate an embodiment of the present invention for fabricating a semiconductor floating gate for an EEPROM with STIs for isolation of the bit lines. STIs are formed in a semiconductor substrate using conventional process methods. A photoresist trench mask is deposited, patterned using conventional lithographic illuminating radiation sources, and developed. The photoresist acts as a mask for the formation of the STIs. A film such as silicon nitride is used to define an exposed area of the STIs above the semiconductor substrate. The exposed areas of the STIs are etched using conventional isotropic, anisotropic, or a combination anisotropic/isotropic etch to achieve increased surface area profiles of the STIs. The isotropic etching step to achieve "bit-line" isolation has the advantage of further increasing the surface area of the ONO layer 410 as it is formed over the cutout areas of the first poly layer 408. The increased surface area profiles for the subsequently formed ONO layer increase the $C_G$ for the devices. Accordingly, the present invention provides gate structures having STIs that afford higher $C_G$ while being compatible with the previously used sequence of processing steps as used for FIG. 2 (PRIOR ART).

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:
1. A semiconductor device comprising:
    a semiconductor substrate;
    shallow trench isolations having surface area profiles extending above the semiconductor substrate and disposed in the semiconductor substrate, the shallow trench isolations having planar top surfaces parallel to the semiconductor substrate, the surface area profiles are convex curves;
    a first dielectric layer disposed on the semiconductor substrate between the shallow trench isolations;
    a first conductive layer disposed over the first dielectric layer and between the insulator shallow trench isola- tions to form a floating gate, the first conductive layer having a planar top surface coplanar with the planar top surfaces of the shallow trench isolations and a conformal top surface conformal to the shallow trench isolations to extend below the planar top surfaces of the shallow trench isolations;

a second dielectric layer disposed over the first conductive layer and in contact with the entire planar top surfaces of the shallow trench isolations, the second dielectric layer conformal to the first conductive layer; and a second conductive layer disposed over the second dielectric layer to form a control gate.

2. The semiconductor device as claimed in claim 1 wherein the second dielectric layer has a top surface which extends below the planar top surfaces of the shallow trench isolations.

3. A semiconductor device comprising:

a semiconductor substrate;

shallow trench isolations having surface area profiles extending above the semiconductor substrate and disposed in the semiconductor substrate, the shallow trench isolations having planar top surfaces parallel to the semiconductor substrate, the surface area profiles are concave curves;

a first dielectric layer disposed on the semiconductor substrate between the shallow trench isolations;

a first conductive layer disposed over the first dielectric layer and between the insulator shallow trench isolations to form a floating gate, the first conductive layer having a planar top surface coplanar with the planar top surfaces of the shallow trench isolations and a conformal top surface conformal to the shallow trench isolations to extend below the planar top surfaces of the shallow trench isolations;

a second dielectric layer disposed over the first conductive layer and in contact with the entire planar top surfaces of the shallow tech isolations, the second dielectric layer conformal to the first conductive layer; and a second conductive layer disposed over the second dielectric layer to form a control gate.

4. The semiconductor device as claimed in claim 3 wherein the second dielectric layer has a top surface which extends below the planar top surfaces of the shallow trench isolations.

5. A semiconductor device comprising:

a semiconductor substrate;

shallow trench isolations having surface area profiles extending above the semiconductor substrate and disposed in the semiconductor substrate, the shallow trench isolations having planar top surfaces parallel to the semiconductor substrate, the surface area profiles are rooftop surfaces;

a first dielectric layer disposed on the semiconductor substrate between the shallow trench isolations;

a first conductive layer disposed over the first dielectric layer and between the insulator shallow trench isolations to form a floating gate, the first conductive layer having a planar top surface coplanar with the planar top surfaces of the shallow trench isolations and a conformal top surface conformal to the shallow trench isolations to extend below the planar top surfaces of the shallow trench isolations;

a second dielectric layer disposed over the first conductive layer and in contact with the entire planar top surfaces of the shallow trench isolations, the second dielectric layer conformal to the first conductive layer; and a second conductive layer disposed over the second dielectric layer to form a control gate.

6. The semiconductor device as claimed in claim 5 wherein the second dielectric layer has a top surface which extends below the planar top surfaces of the shallow trench isolations.

7. A semiconductor device comprising:

a semiconductor substrate;

shallow trench isolations having surface area profiles extending above the semiconductor substrate and disposed in the semiconductor substrate, the shallow trench isolations having planar top surfaces parallel to the semiconductor substrate, the surface area profiles are convex curves;

a tunnel oxide layer disposed on the semiconductor substrate between the shallow trench isolations;

a first polysilicon layer disposed over the tunnel oxide layer and between the insulator shallow trench isolations to form a floating gate, the first polysilicon layer having a planar top surface coplanar with the planar top surfaces of the shallow trench isolations and a conformal top surface conformal to the shallow trench isolations to extend below the planar top surfaces of the shallow trench isolations;

an oxynitride layer disposed over the first polysilicon layer and the in contact with the entire planar top surfaces of the shallow trench isolations, the oxynitride layer conformal to the first conductive layer; and a second polysilicon layer disposed over the oxynitride layer to form a control gate.

8. The semiconductor devices as claimed in claim 7 wherein the oxynitride layer has a top surface which extends below the planar top surfaces of the shallow trench isolations.

9. A semiconductor device comprising:

a semiconductor substrate;

shallow trench isolations having surface area profiles extending above the semiconductor substrate and disposed in the semiconductor substrate, the shallow trench isolations having planar top surfaces parallel to the semiconductor substrate, the surface area profiles are concave curves;

a tunnel oxide layer disposed on the semiconductor substrate between the shallow trench isolations;

a first polysilicon layer disposed over the tunnel oxide layer and between the insulator shallow trench isolations to form a floating gate, the first polysilicon layer having a planar top surface coplanar with the planar top surfaces of the shallow trench isolations and a conformal top surface conformal to the shallow trench isolations to extend below the planar top surfaces of the shallow trench isolations;

an oxynitride layer disposed over the fist polysilicon layer and the in contact with the entire planar top surfaces of the shallow trench isolations, the oxynitride layer conformal to the first conductive layer; and a second polysilicon layer disposed over the oxynitride layer to form a control gate.

10. The semiconductor devices as claimed in claim 9 wherein the oxynitride layer has a top surface which extends below the planar top surfaces of the shallow trench isolations.

11. A semiconductor device comprising:

a semiconductor substrate;

shallow trench isolations having source area profiles extending above the semiconductor substrate and disposed in the semiconductor substrate, the shallow trench isolations having planar top surfaces parallel to the semiconductor substrate, the surface area profiles are rooftop surfaces;

a tunnel oxide layer disposed on the semiconductor substrate between the shallow trench isolations;

a first polysilicon layer disposed over the tunnel oxide layer and between the insulator shallow trench isolations to form a floating gate, the first polysilicon layer having a planar top surface coplanar with the planar top surfaces of the shallow trench isolations and a conformal top surface conformal to the shallow trench isolations to extend below the planar top surfaces of the shallow trench isolations;

an oxynitride layer disposed over the first polysilicon layer and the in contact with the entire planar top surfaces of the shallow trench isolations, the oxynitride layer conformal to the first conductive layer; and a second polysilicon layer disposed over the oxynitride layer to form a control gate.

12. The semiconductor devices as claimed in claim 11 wherein the oxynitride layer has a top surface which extends below the planar top surfaces of the shallow trench isolations.

* * * * *